(12) United States Patent
Lee et al.

(10) Patent No.: US 8,258,764 B2
(45) Date of Patent: Sep. 4, 2012

(54) DRIVING DEVICE

(75) Inventors: Kyoung-Min Lee, Seoul (KR); Yun-kee Lee, Bucheon (KR); Duck-Ki Kwon, Incheon (KR); Ju-ho Kim, Seoul (KR); Eun-Chul Kang, Seoul (KR)

(73) Assignee: Fairchild Korea Semiconductor Ltd., Bucheon, Kyungki-Do (KR)

( * ) Notice: Subject to any disclaimer, the term of this patent is extended or adjusted under 35 U.S.C. 154(b) by 406 days.

(21) Appl. No.: 12/476,800

(22) Filed: Jun. 2, 2009

(65) Prior Publication Data

US 2009/0295358 A1    Dec. 3, 2009

(30) Foreign Application Priority Data

Jun. 2, 2008   (KR) .................. 10-2008-0051574

(51) Int. Cl.
   *G05F 1/40*   (2006.01)

(52) U.S. Cl. ...................................... 323/273

(58) Field of Classification Search .................. 323/234, 323/265, 273, 299, 304, 311, 318, 349, 271, 323/272

See application file for complete search history.

(56) References Cited

U.S. PATENT DOCUMENTS

| | | | |
|---|---|---|---|
| 3,214,668 A | 10/1965 | Brinster | |
| 3,336,521 A | 8/1967 | Russell | |
| 3,530,367 A | 9/1970 | Gardenghi | |
| 3,742,338 A | 6/1973 | Sugano et al. | |
| 3,881,150 A | 4/1975 | Gay | |
| 4,591,739 A * | 5/1986 | Nagano | 323/311 |
| 6,414,655 B1 * | 7/2002 | Morimoto | 345/60 |
| 6,756,752 B2 * | 6/2004 | Wolfel | 318/139 |

* cited by examiner

*Primary Examiner* — Adolf Berhane
(74) *Attorney, Agent, or Firm* — Alston & Bird LLP

(57) ABSTRACT

The present invention relates to a driving device. The driving device according to the present invention includes a main transistor that supplies a current to a load by using a power supply, an auxiliary transistor that drops a predetermined voltage of the voltage of the power supply and transmits the dropped voltage to the main transistor in a turn-on state, and a bypass switch that transmits the voltage of the power supply to the main transistor when the auxiliary transistor is turned off.

20 Claims, 7 Drawing Sheets

DRIVING DEVICE

CROSS-REFERENCE TO RELATED APPLICATION

This application claims priority to and the benefit of Korean Patent Application No. 10-2008-0051574 filed in the Korean Intellectual Property Office on Jun. 2, 2008, the entire contents of which are incorporated herein by reference.

BACKGROUND OF THE INVENTION (a) Field of the Invention

The present invention relates to a driving device. More particularly, it relates to a driving device that includes a transistor as a switch and that supplies power to a load.

(b) Description of the Related Art

A driving device is designed to operate in a high supply voltage environment. In this case, an internal pressure (i.e., withstanding voltage) that each element of the driving device can endure varies. A transistor which is a switch has a breakdown voltage as the internal pressure. The breakdown voltage is decreased as density of a current flowing between a drain and a source is increased. When the driving device includes the transistor and a high-level power voltage is supplied to the driving device, an integrated circuit (IC) should be designed in consideration of the current flowing through the drain and source of the transistor and the corresponding breakdown voltage. Therefore, it is very difficult to manufacture a driving device that operates in a high-level voltage range.

Further, a driving device that is designed to a common voltage range cannot be used if a supply voltage level is increased. In addition, an existing driving device cannot be used for designing a product for a voltage range that is higher than the common voltage range.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a driving device that can stably operate in a supply voltage environment that is higher than a voltage of a transistor thereof.

A driving device according to an exemplary embodiment of the present invention includes a main transistor that supplies a current to a load by using a power supply, at least one auxiliary transistor that drops a predetermined voltage among voltages of the power supply and transmits the dropped voltage to the main transistor in a turn-on state, and at least one bypass switch that transmits the voltage of the power supply to the main transistor when the at least one auxiliary transistor is turned off.

The at least one auxiliary transistor has a first electrode and a second electrode respectively connected to the power supply and a first electrode of the main transistor, and lateral ends of the at least one bypass switch are respectively connected to the power supply and the first electrode of the main transistor.

A regulated voltage that is a constant voltage is applied to a control electrode of the main transistor, and a voltage of a voltage source is applied to a control electrode of the at least one auxiliary transistor.

Here, the voltage of the voltage source is not higher than a predetermined maximum voltage and varies according to a voltage of the power supply.

The predetermined maximum voltage is set by a sum of a maximum threshold voltage allowed to the first and second electrodes of the main transistor and the regulated voltage.

The power supply includes a positive electrode and a negative electrode, and the driving device includes a current limiting element having a first end connected to the positive electrode, a first Zener diode string having a first end connected to a second end of the current limiting element, and a second Zener diode string having a first end connected to a second end of the first Zener diode string.

The regulated voltage is a voltage at a first end of the second Zener diode, and the voltage source is a voltage at a first end of the first Zener diode.

The driving device further includes a current source connected in parallel with the first Zener diode string, and when a voltage of the power supply is low, a voltage that is dropped by a voltage at the lateral ends of the current limiting element and a voltage at the lateral ends of the current source from the voltage of the power supply is supplied to the second Zener diode string.

The first and second Zener diode strings respectively include at least one Zener diode, and the number of Zener diodes is determined according to the regulated voltage and a maximum voltage of the voltage source.

The first Zener diode string includes a number of multi-layered Zener diodes determined according to the regulated voltage, and the Zener diodes are connected in series and are multi-layered.

The second Zener diode string includes a number of Zener diodes determined according to the maximum voltage source, and the Zener diodes are connected in series and are multi-layered.

The current limiting element is a depletion-type NMOSEFT of which a gate and a source are connected and a drain is connected to the power supply.

The current limiting element may be a resistor having a first end connected to the power supply and a second end connected to a first end of the first Zener diode.

The at least one bypass switch is realized as a depletion-type MOSFET element, and has a first electrode connected to the power supply and a second electrode connected to the first electrode of the main transistor. The main and auxiliary transistors are NMOSFET elements, and the at least one bypass switch is a depletion-type NMOSFET element.

In the driving device according to the exemplary embodiment of the present invention, the at least one auxiliary transistor includes two or more auxiliary transistors, and the two or more auxiliary transistors have a multi-layered structure by being connected between the power supply and the first electrode of the main transistor.

The number of bypass switches is the same as the number of the two or more auxiliary transistors.

Two or more voltage sources are respectively connected to control electrodes of the two or more auxiliary transistors, and a constant regulated voltage is applied to a control electrode of the main transistor.

The driving device further includes a first Zener diode string including at least one Zener diode having lateral ends connected between the control electrode of each of the two or more auxiliary transistors, and a second Zener diode string including at least one Zener diode having lateral ends connected to a control electrode of an auxiliary transistor that is adjacent to the main transistor among the two or more auxiliary transistors and the control electrode of the main transistor.

The driving device further includes a first current source connected in parallel with the first Zener diode string, and a second current source connected in parallel with the second Zener diode string.

The driving device includes two or more bypass switches located corresponding to each of the two or more auxiliary transistors. Each of the two or more bypass switches has a first end connected to the power supply and a second end connected to an electrode interposed between the corresponding auxiliary transistor and the main transistor, and is turned on when the voltage of the power supply is decreased so that the corresponding auxiliary transistor is turned off. The bypass switch may be realized as a depletion-type MOSFET.

As described, according to the exemplary embodiment of the present invention, a driving device can prevent breakdown of a main transistor by turning on an auxiliary transistor in a high-voltage process in which a voltage of a power supply is high.

In addition, the driving device according to the exemplary embodiment of the present invention directly connects the power supply to the main transistor when the voltage of the power supply is low to thereby supply sufficient current to a load.

DETAILED DESCRIPTION OF THE EMBODIMENTS

Figure 1:
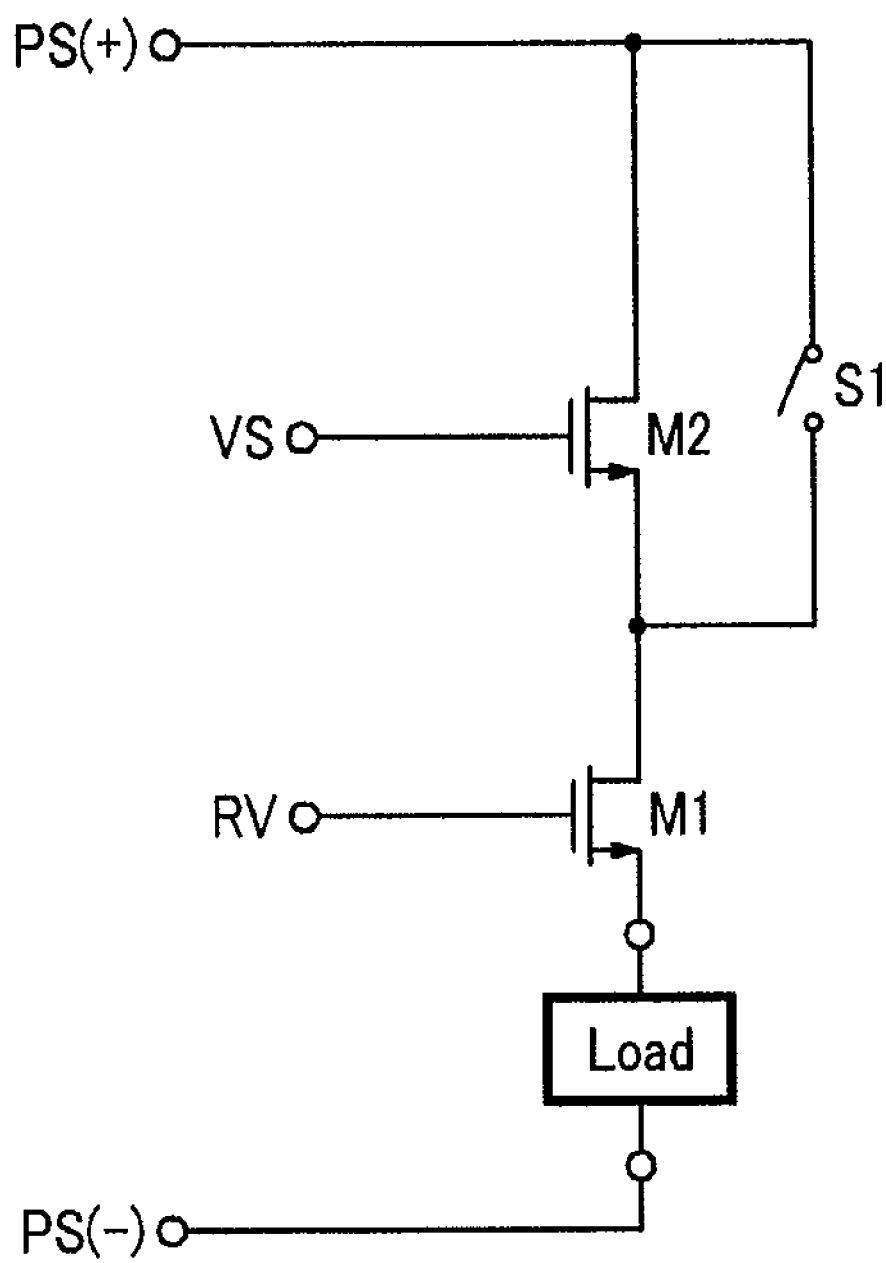
FIG. 1 shows a driving device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 shows a driving device according to an exemplary embodiment of the present invention.

As shown in FIG. 1, a driving device includes a main transistor M1 that supplies a current to a load, an auxiliary transistor M2 connected in series to the main transistor M1, and a bypass switch S1 connected in parallel with the auxiliary transistor M2. The auxiliary transistor M2 drops a predetermined voltage of a power voltage to prevent an excessive voltage from being supplied to the main transistor M1 and supplies the predetermined voltage to the main transistor M1. When a voltage of a power supply PS is decreased, the bypass switch S1 is turned on and the auxiliary transistor M2 is turned off so that the voltage of the power supply PS is supplied to the main transistor M1.

A drain of the auxiliary transistor M2 is connected to a positive (+) electrode of the power supply PS, and a source of the auxiliary transistor M2 is connected to a drain of the main transistor M1. The bypass switch S1 is connected to the auxiliary transistor M2 in parallel. A source of the main transistor M1 is connected to a first end of the load LOAD. A negative (−) electrode of the power supply PS is connected to a second end of the load LOAD. In a high-voltage process in which the power supply PS supplies a high voltage, it is difficult for the main transistor M1 to stably control a high drain-source current of a high drain-source voltage. When the drain-source current is increased according to the high drain-source voltage, a breakdown voltage is decreased, and the main transistor M1 can be easily in a breakdown condition by the high drain-source voltage. The auxiliary transistor M2 decreases a voltage applied to the drain of the main transistor M1 in order to reduce the drain-source voltage of the main transistor M1. Then, the main transistor M1 can be prevented from being in the breakdown condition.

A regulated voltage RV is supplied to a gate of the main transistor M1, and a voltage source VS is connected to a gate of the auxiliary transistor M2.

The power supply PS may have a voltage range between the lowest voltage that can supply a current to the load LOAD through the main transistor M1 and the highest voltage that can change the main transistor M1 to be in the breakdown condition. Therefore, when the voltage of the power supply PS is low, the auxiliary transistor M2 is turned off and the bypass switch S1 is turned on to supply the voltage of the power supply PS to the drain of the transistor M1 to thereby generate a current to be supplied to the load LOAD. On the contrary, when the voltage of the power supply PS is high, the auxiliary transistor M2 should be turned on to decrease the voltage of the power supply PS supplied to the drain of the main transistor M1. Therefore, in order to prevent the breakdown condition of the main transistor M1, the voltage source VS has a constant voltage that is sufficient to turn on the auxiliary transistor M2 when the voltage of the power supply PS is high, and when the voltage of the power supply PS is decreased, the voltage of the voltage source VS is also decreased so that it can turn off the auxiliary transistor M2. In the exemplary embodiment of the present invention, the voltage source VS has a value that is higher than the regulated voltage RV, and the power source PS has a value that is higher than the voltage source VS.

In particular, the regulated voltage RV maintains a constant value. The voltage source VS is determined by a voltage obtained by subtracting the regulated voltage RV from the voltage of the power supply PS, and when the power supply PS has a high voltage, the high voltage cannot limit a predetermined maximum voltage. The predetermined maximum voltage can be defined by a value obtained by adding a maximum threshold voltage to the regulated voltage RV. The maximum threshold voltage is a random value that is lower than the breakdown voltage of the main transistor M1 for preventing the breakdown condition of the main transistor M1. Then, although the power supply PS has a high voltage, the auxiliary transistor M2 is turned on so that a voltage supplied to the drain and source of the main transistor M1 cannot be higher than the maximum threshold voltage.

For example, a Zener breakdown voltage of the main transistor and the auxiliary transistor is 40V, and accordingly, the maximum threshold voltage is set to 40V. In addition, the voltage of the power supply PS is set to 50V, the regulated voltage is set to 6V, the voltage of the voltage source VS is set to 18V, and a threshold voltage of the main transistor M1 and the auxiliary transistor M2 is set to 1V. Characteristics of the main transistor M1 are set to be the same as those of the auxiliary transistor M2. When a voltage at the source of the main transistor M1 is 5V, a voltage difference between the gate and the source of the main transistor M1 becomes the threshold voltage so that the main transistor M1 is turned on. Since a current that is the same as that flowing to the main transistor M1 flows to the auxiliary transistor M2, a voltage at the source of the auxiliary transistor M2 becomes 17V. The source of the auxiliary transistor M2 and the drain of the main transistor M1 are the same node, and therefore the voltage at the drain of the main transistor M1 becomes 17V. Then, a drain-source voltage of the auxiliary transistor M2 becomes 33V, and a drain-source voltage of the main transistor M1 becomes 12V. In this way, the drain-source voltage of the main transistor M1 is decreased by the auxiliary transistor M2 so that the breakdown phenomenon of the main transistor M1 can be prevented.

As the power of the power supply PS is decreased, the voltage of the voltage source VS is determined within a range that is lower than the maximum voltage in accordance with the voltage of the power supply. The main transistor M1 and the auxiliary transistor M2 are driven in a saturation region, and the drain-source voltage of each transistor should be greater than a predetermined value. Since the drain voltage of the auxiliary transistor M2 is the voltage of the power supply PS, the voltage of the power supply PS is decreased, and when a voltage difference between the gate voltage of the auxiliary transistor M2 and the drain voltage of the main transistor M1, that is, the source voltage of the auxiliary transistor M2, is lower than the threshold voltage, current supply may become unstable. In order to prevent this, in the exemplary embodiment of the present invention, when the voltage of the power source PS is decreased, the voltage of the voltage source VS is decreased, and accordingly the source voltage of the auxiliary transistor M2 is decreased so then the drain-source voltage of the auxiliary transistor M2 is increased as much as the voltage of the voltage source VS is decreased. Then, the driven region of the auxiliary transistor M2 can be maintained.

For example, assume that the regulated voltage RV is 6V, the source voltage of the main transistor M1 is 4V, and the voltage of the power source PS is 18V. With this assumption, when the gate-source voltages of the main and auxiliary transistors M1 and M2 are 2V, it is assumed that the drain voltage of the main transistor M1 is 10V with the assumption that a drain-source voltage for driving in the saturation region is higher than 6V. Then, in order to control the current that is the same as that flowing to the main transistor M1 to flow to the auxiliary transistor M2, the voltage of the voltage source VS becomes 12V and the drain-source voltage of the auxiliary transistor M2 becomes 8V, and therefore the auxiliary transistor M2 can be driven in the saturation region. Accordingly, the same current can flow to the two transistors. If the voltage of the voltage source VS maintains the maximum voltage (i.e., 18V) regardless of the voltage of the power source PS, the source voltage of the auxiliary transistor M2 becomes 16V so that the drain-source voltage becomes 2V. Then, the auxiliary transistor M2 operates in a linear region and the main transistor M1 operates in the saturation region so that currents flowing to the two transistors M1 and M2 cannot be the same. Accordingly, a current supplied to the load varies.

Since the voltage of the voltage source VS is decreased as the voltage of the power source PS is decreased, the auxiliary transistor M2 cannot be fully turned on when a voltage difference between the source voltage of the auxiliary transistor M2 and the voltage of the voltage source VS is lower than the threshold voltage. In this case, the bypass switch S1 is turned on and the voltage of the power source PS is directly transmitted to the drain of the main transistor M1 so that the load LOAD can be supplied with a required current.

Hereinafter, a configuration for generating the voltage of the power source VS and the regulated voltage RV will be described in further detail.

Figure 2:
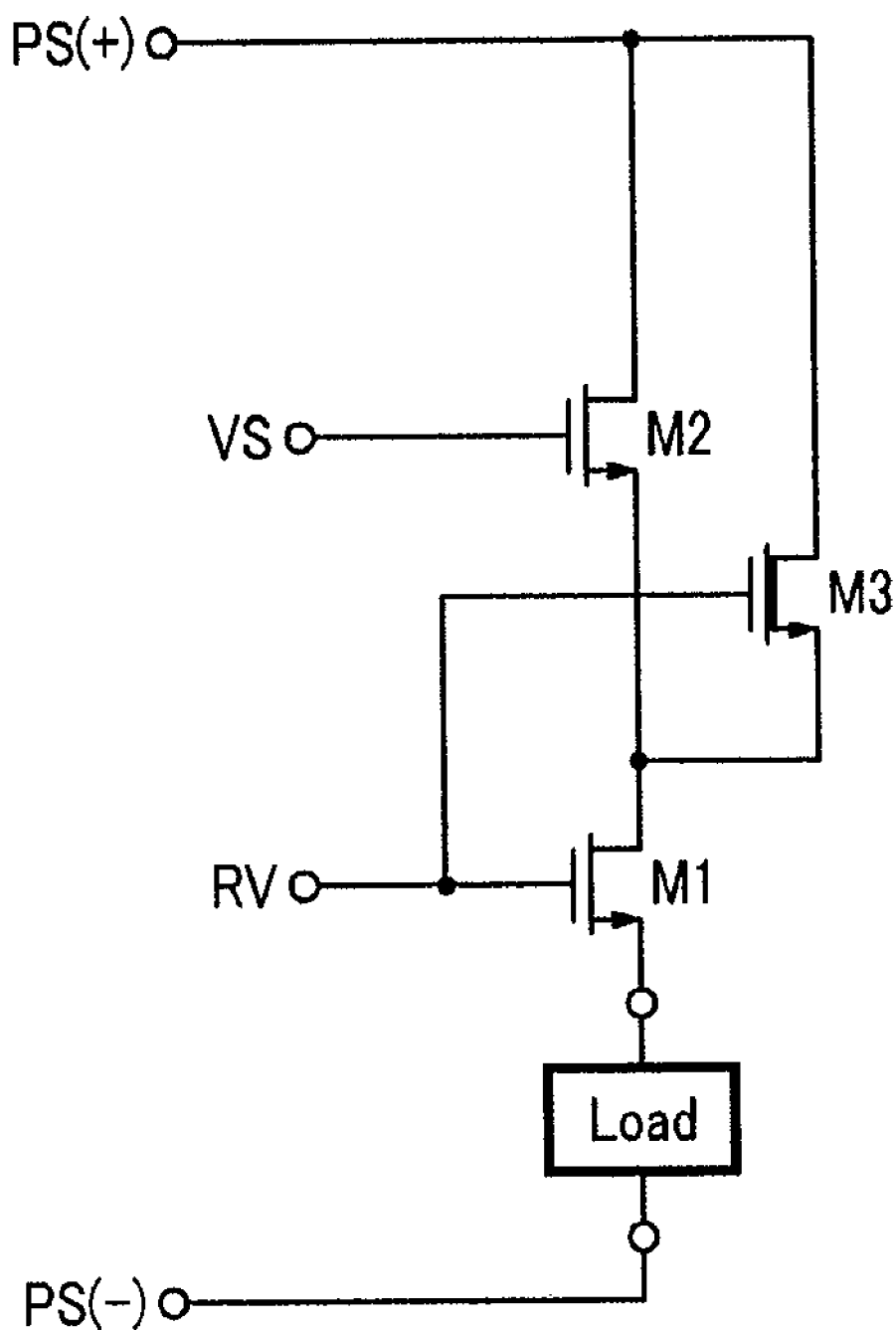
FIG. 2 is a circuit diagram of a depletion n-channel metal-oxide field-effect transistor (NMOSFET) type of bypass of the driving device according to the exemplary embodiment of the present invention.

FIG. 2 is a circuit diagram showing a case in which the bypass switch S1 of the driving device according to the exemplary embodiment of the present invention is a depletion n-channel metal-oxide field-effect transistor (NMOSFET).

As shown in FIG. 2, the bypass switch S1 can be realized as a depletion-type NMOSFET M3. The depletion type NMOS is turned on when a voltage difference between a gate and a source is higher than a threshold voltage. In this case, the threshold voltage of the depletion type NMOSFET may be a negative voltage. The regulated voltage RV is applied to the gate of the transistor M3, the source of the transistor M3 is connected to the drain of the main transistor M1 and the source of the auxiliary transistor M2, and a positive electrode (+) of the power supply PS is connected to the drain of the transistor M3. Since the regulated voltage RV is maintained at a constant level, the transistor M3 is turned on/off according to the source voltage. When the voltage of the power supply PS is decreased, the source voltage of the transistor M3 is decreased, and when a difference between the decreasing source voltage and the regulated voltage RV is higher than the threshold voltage, the transistor M3 is turned on. In further detail, when the threshold voltage of the transistor M3 is set to −2V and the regulated voltage RV is set to 6V, the transistor M3 is turned on at a time that the source voltage of the transistor M3 becomes lower than 8V. Then, the positive electrode (+) of the power supply PS is directly connected to the drain of the main transistor M1.

As described, when the voltage of the power supply PS is decreased so that the drain voltage of the main transistor M1 is decreased lower than a predetermined level, the transistor M3 is turned on. Then, the voltage of the power supply PS can be directly applied to the drain of the main transistor M1. At a time that the transistor M3 is turned on, a voltage difference between the voltage of the voltage VS and the source voltage of the auxiliary transistor M2 is lower than the threshold voltage of the auxiliary transistor M2.

Figure 3:
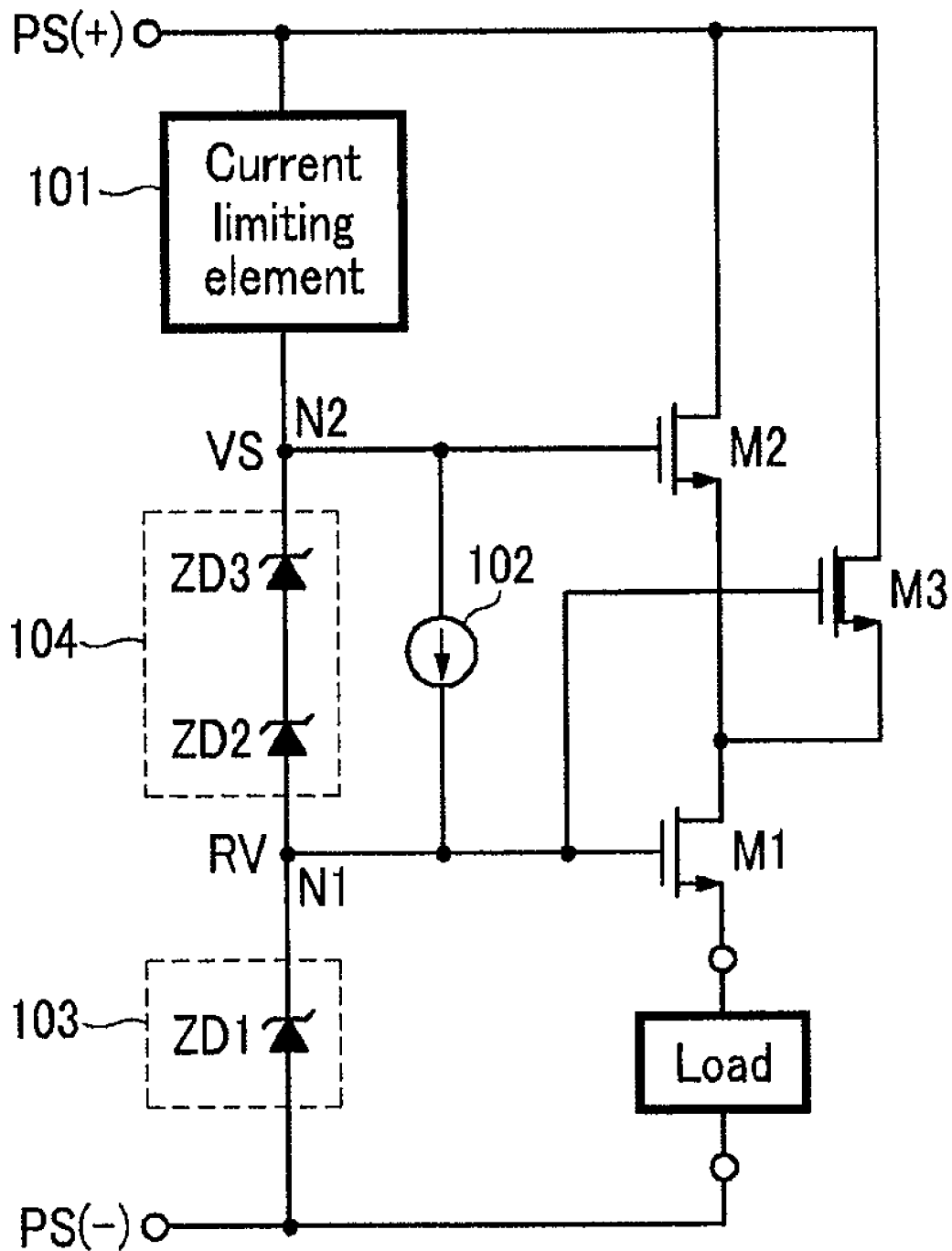
FIG. 3 is a circuit diagram of a configuration that generates a voltage source and a regulated voltage according to the exemplary embodiment of the present invention.

FIG. 3 shows a circuit diagram of a configuration that generates the voltage source VS and the regulated voltage RV according to the exemplary embodiment of the present invention.

As shown in FIG. 3, the driving device according to the exemplary embodiment of the present invention includes a current limiting element 101, a current source 102, a first Zener diode string 103, and a second Zener diode string 104. The current limiting element 101, the first Zener diode string 103, and the second Zener diode string 104 are connected between the positive (+) electrode and the negative (−) electrode of the power supply PS. The first Zener diode string 103 includes a Zener diode ZD1, and the second Zener diode string 104 includes two Zener diodes ZD2 and ZD3 connected in series. The current source 102 is connected in parallel with the second Zener diode string 104. The Zener diode has a characteristic (hereinafter referred to as Zener breakdown) that it is turned on and a current flows therethrough when a voltage that is higher than a breakdown voltage is applied between the cathode and the anode. That is, when a voltage at a cathode of the Zener diode is higher than a voltage at an anode by the Zener breakdown voltage, the Zener diode is turned on and the current flows from the cathode to the anode. A voltage that is obtained by subtracting a voltage drop due to the current limiting element 101 from the voltage of the power supply PS is applied to the second Zener diode string 104 and the first Zener diode string 103. In this case, when the voltage of the power supply PS is low, both Zener diodes ZD2 and ZD3 of the second Zener diode string 104 cannot be turned on. When a path including the current source 102 is not provided, the first Zener diode string 103 is not supplied with a sufficient voltage so that the Zener diode ZD1 cannot be turned on unless the second Zener diode string 104 is turned on. In the exemplary embodiment of the present invention, the regulated voltage RV should always be maintained at a constant voltage level, and therefore the current source 102 is required to control the voltage of the power supply PS to be applied to the first Zener diode string 103 without passing through the second Zener diode string 104. A breakdown voltage for generating Zener breakdown may be different for each Zener diode, but the Zener diodes ZD1 to ZD3 in the present exemplary embodiment of the present invention are set to have the same breakdown voltage. In addition, the first Zener diode string 103 and the second Zener diode string 104 respectively include one Zener diode ZD1 and two Zener diodes ZD2 and ZD3 in the exemplary embodiment of the present invention, but the present invention is not limited thereto. That is, each of the first and second Zener diode strings 103 and 104 may have an appropriate number of Zener diodes according to the maximum voltage level of the regulated voltage RV and the voltage source VS. For example, a breakdown voltage of each of the Zener diodes ZD1 to ZD3 is set to 6V. Then, the regulated voltage RV cannot be higher than 6V, and the voltage of the voltage source VS cannot be higher than 18V. The voltage of the power supply PS is maintained to be higher than the voltage of the node N2 by the amount of voltage dropped by the current limiting element 101. According to the voltage of the power supply PS, a voltage applied to lateral ends of the current limiting element 101 is changed. A voltage obtained by subtracting the voltage applied to the lateral ends of the current limiting element 101 from the power supply PS is applied to a cathode of the Zener diode ZD3 of the second Zener diode string 104. In this case, when the voltage applied to the node N2 is higher than 18V, a voltage difference between a cathode and an anode of each of the Zener diodes ZD1 to ZD3 becomes higher than the breakdown voltage so that the regulated voltage becomes 6V and the voltage of the voltage source VS becomes 18V. However, when the voltage applied to the node N2 is lower than 18V, a voltage between the cathode and the anode of the Zener diode ZD1 may be lower than the breakdown voltage. In this case, a voltage that is dropped as much as the voltage at the lateral ends of the current limiting element 101 and the voltage at the lateral ends of the current source 102 from the voltage of the power supply PS is applied to the node N1 through the path including the current source 102. Then, a voltage that is higher than the voltage applied through the second Zener diode string 104 is applied to the cathode of the Zener diode ZD1. This voltage becomes higher than the breakdown voltage of the Zener diode ZD1 so that the Zener diode ZD1 is turned on and the regulated voltage is maintained at 6V. In addition, a voltage corresponding to a voltage difference between the voltage applied to the node N2 and the regulated voltage RV is applied to the lateral ends of the second Zener diode string 104 and the Zener breakdown is not generated in each of the Zener diodes ZD2 and ZD3, and accordingly, only a fine leakage current flows to the second Zener diode string 104. Although the voltage of the power supply PS is decreased and thus the voltage of the node N2 is decreased, the auxiliary transistor M2 maintains the turn-on state when a voltage difference between the source and the gate of the auxiliary transistor M2 is higher than the threshold voltage of the auxiliary transistor M2. The voltage of the voltage source VS is decreased and the source voltage of the auxiliary transistor M2 is decreased as the voltage of the power supply PS is decreased, and therefore the same current can flow to the main transistor M1 and to the auxiliary transistor M2.

However, when the voltage of the power supply PS is decreased and thus the voltage difference between the voltage of voltage source VS and the source voltage of the auxiliary transistor M2 becomes lower than the threshold voltage of the auxiliary transistor M2, the auxiliary transistor M2 is not sufficiently turned on so that insufficient current flows to the main transistor M1. When the voltage difference between the voltage of the voltage source VS and the source voltage of the auxiliary transistor M2 becomes lower than the threshold voltage of the auxiliary transistor M2, the bypass switch S1 is turned on to supply a voltage of the power supply PS to the drain of the main transistor M1 to thereby supply a current of the main transistor M1 for the load.

For example, the voltage of the power supply PS is set to 8V, the voltage at the lateral ends of the current limiting element 101 is set to 0.5V, the source voltage of the main transistor M1 is set to 5V, and the drain voltage of the main transistor M1 is set to 8V. Then, since the gate voltage of the auxiliary transistor M2 is 7.5V, the gate-source voltage of the auxiliary transistor M2 becomes lower than the threshold voltage, and accordingly, the auxiliary transistor M2 is turned off. In this case, the bypass switch S1 is in the turn-on state. The power supply PS supplies an 8V voltage to the drain of the main transistor M1 through the bypass switch S1.

Figure 4:
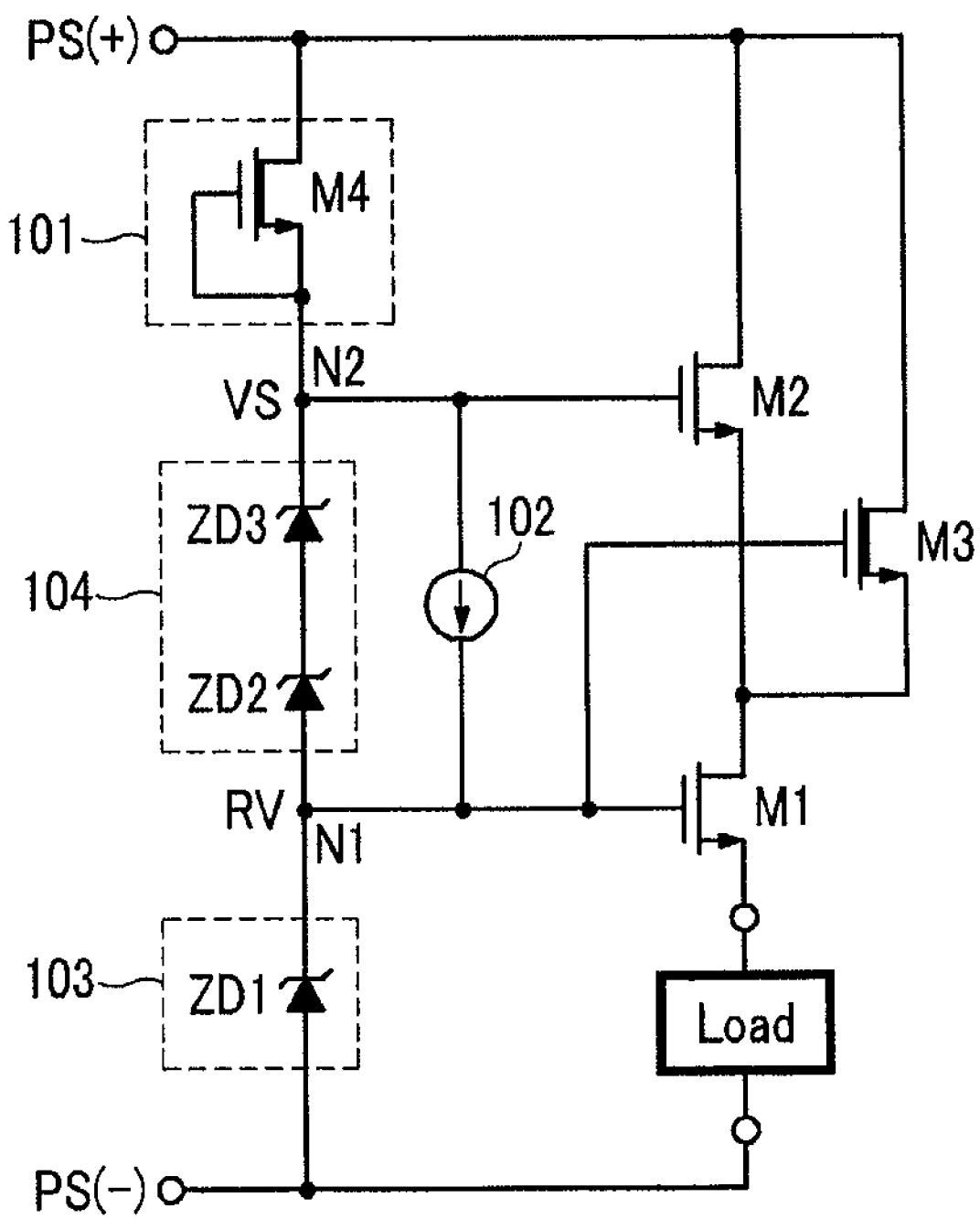
FIG. 4 shows a driving device having a current limiting element according to the exemplary embodiment of the present invention, realized in a depletion-type NMOSFET.

FIG. 4 shows a driving device having the current limiting element 101 according to the exemplary embodiment of the present invention, realized in the depletion-type NMOSFET.

The current limiting element 101 can be realized by using a depletion-type NMOSFET M4. A gate and a source of the depletion-type NMOSFET M4 are connected to each other so that the depletion-type NMOSFET M4 is always in the turn-on state, and the depletion-type NMOSFET M4 is connected between the power supply PS and the node N2. In the turn-on state, the depletion-type NMOSFET M4 has a predetermined on-resistance. The voltage subtracting the voltage applied to the first and second Zener diode strings 103 and 104 from the voltage of the power supply PS is applied to the NMOSFET M4. Therefore, the depletion-type NMOSFET M4 controls the voltage of the node N2, that is, the voltage of the voltage source VS is to always be lower than the voltage of the power supply PS. In addition, the gate electrode and source electrode of the NMOSFET M4 are connected. Then a current flowing between the drain electrode and source electrode is substantially constant regardless of the voltage between the drain electrode and source electrode in a saturation operating region of the NMOSFET M4. Therefore, the NMOSFET M4 prevents an over-current from flowing into the first and second Zener diode strings 103 and 104. The bypass switch S1 is realized as the depletion-type NMOSFET M3 as previously described. When the voltage of the power supply PS is decreased and thus a voltage difference between the gate voltage and the source voltage of the transistor M3 becomes higher than the threshold voltage of the transistor M3, the transistor M3 is turned on so that the voltage of the power supply PS can be supplied to the drain of the main transistor M1.

Figure 5:
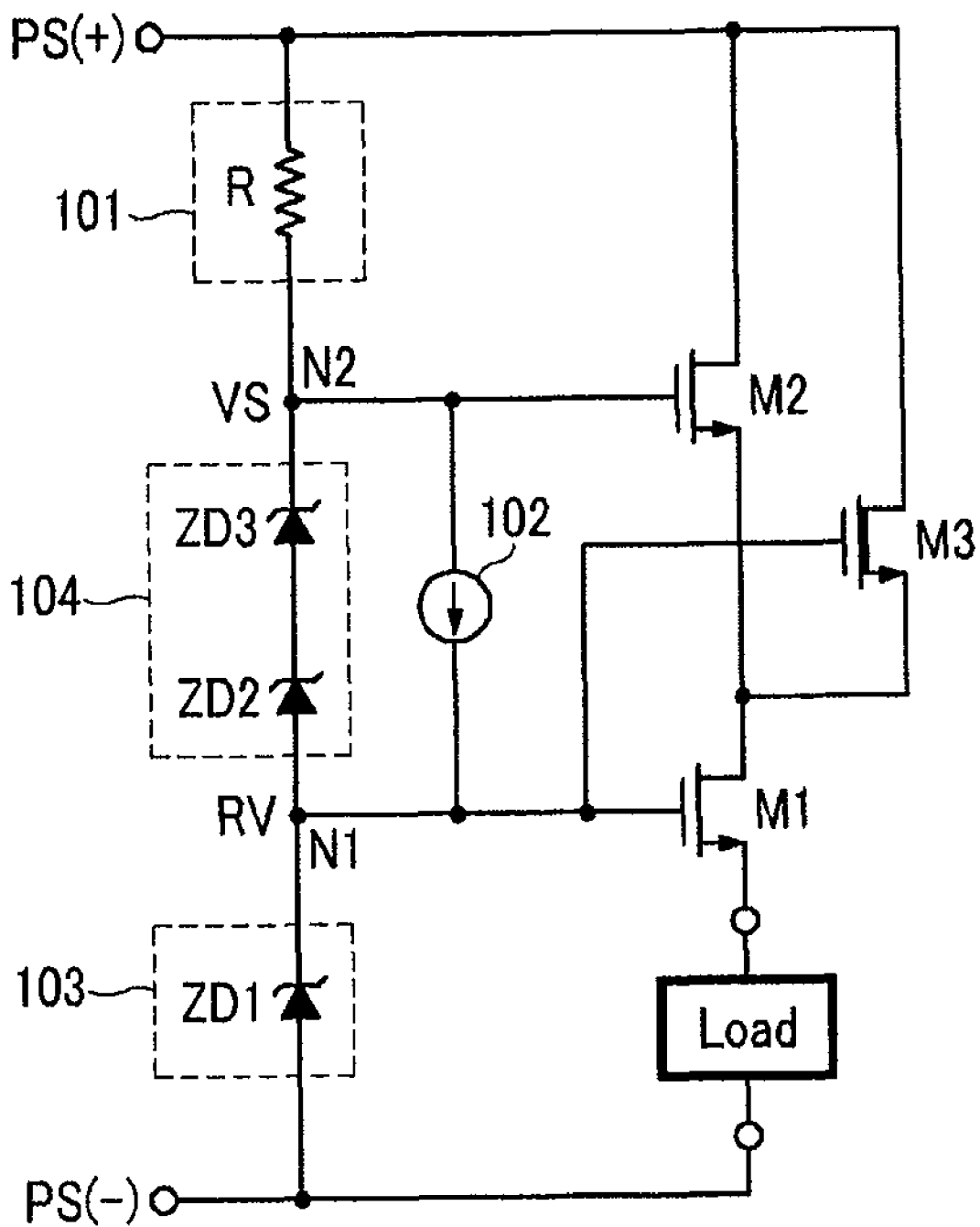
FIG. 5 shows a driving device having the current limiting element according to the exemplary embodiment of the present invention, realized as a resistor.

FIG. 5 shows a driving device having the current limiting element 101 according to the exemplary embodiment of the present invention, realized as a resistor R.

A resistor R is connected between the power supply PS and the node N2, and controls the voltage of the power supply PS to be always higher than the voltage of the node N2, that is, the voltage of the voltage source VS.

Hereinbefore, the driving device including one auxiliary transistor according to the exemplary embodiment of the present invention has been described.

However, the present invention is not limited thereto, and the driving transistor may include two or more auxiliary transistors to decrease a voltage between the drain and source of the main transistor that is directly connected to the load LOAD.

Figure 6:
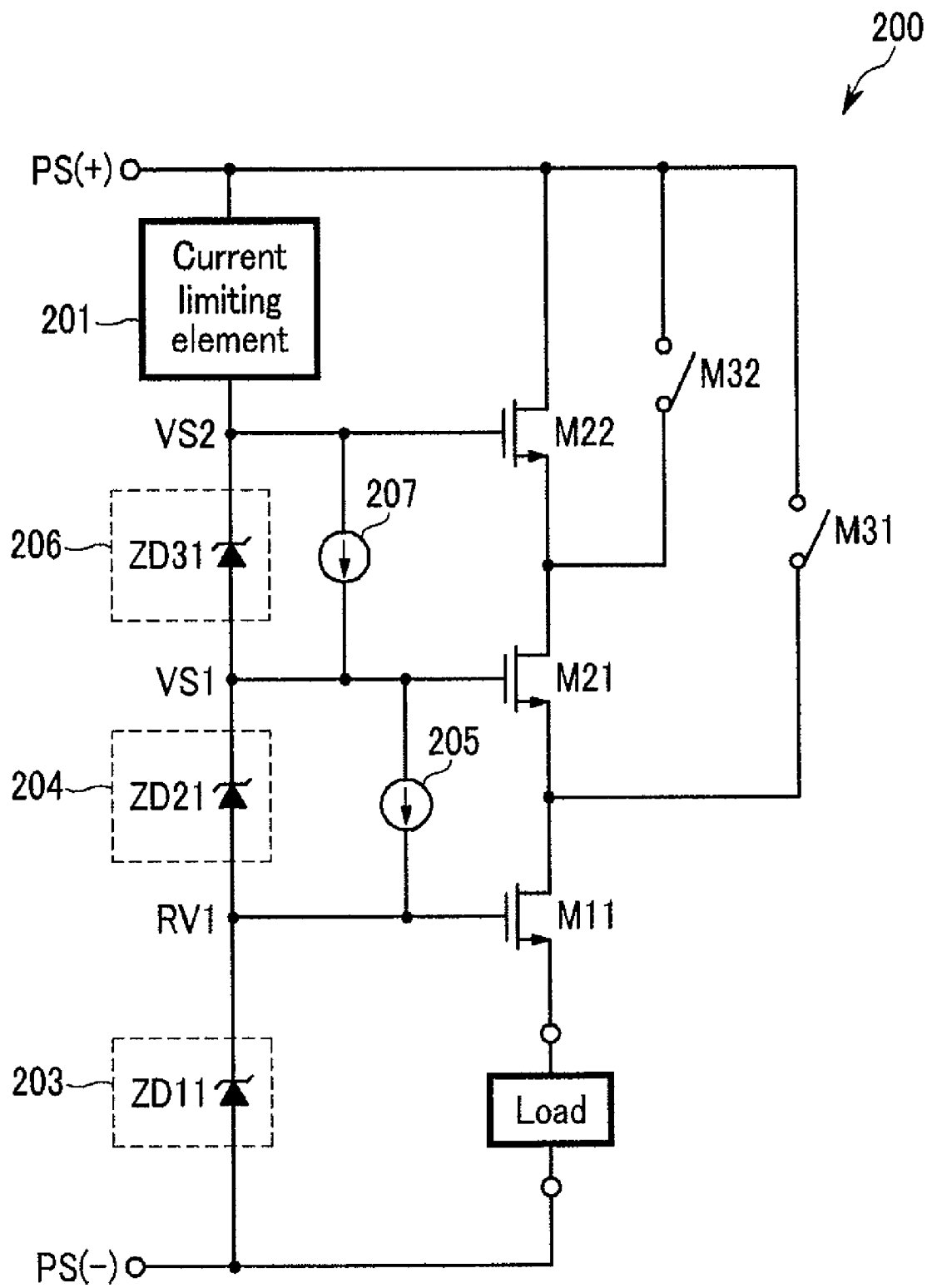
FIG. 6 shows a driving device according to another exemplary embodiment of the present invention.

FIG. 6 shows a driving device according to another exemplary embodiment of the present invention. As shown in FIG. 6, the driving device according to the other exemplary embodiment of the present invention includes two auxiliary transistors M21 and M22.

A driving device 200 includes a current limiting element 201, a first current source 205, the second current source 207, the third Zener diode string 203, a fourth Zener diode string 204, a fifth Zener diode string 206, a first bypass switch M31, and a second bypass switch M32. The current limiting element 201, the third Zener diode string 203, the fourth Zener diode string 204, and the fifth Zener diode string 206 are connected between a positive (+) electrode and a negative (−) electrode of a power supply PS. The third Zener diode string 203 includes a Zener diode ZD11, the fourth Zener diode string 204 includes a Zener diode ZD21, and the fifth Zener diode string 206 includes a Zener diode ZD31. The first current source 205 is connected in parallel with the fourth Zener diode string 204, and the second current source 207 is connected in parallel with the fifth Zener diode string 206. The number of Zener diodes included in the third to fifth Zener diode strings 203, 204, and 206 determines a voltage of a regulated voltage RV, a voltage of a first voltage source VS1, and a voltage of a second voltage source VS2.

In the other exemplary embodiment of the present invention, the fourth and fifth Zener diode strings 204 and 206, the first and second current sources 205 and 207, the auxiliary transistors M21 and M22, and the bypass switches M31 and M32 perform the same functions as the Zener diode string 104, the current source 102, the auxiliary transistor M2, and the bypass switch M3 of the previously-described exemplary embodiment.

That is, in the high-voltage process in which the voltage of the power supply PS is sufficiently high, the voltage of the power supply PS is distributed to the load LOAD, the main transistor M11, and the auxiliary transistors M21 and M22. When the voltage of the power supply PS is decreased to a predetermined voltage, the bypass switches M31 and M32 are turned on so that a sufficient voltage is supplied to the main transistor M11, the regulated voltage RV1 is constantly maintained, and the voltages of the first and second voltage sources VS1 and VS2 are decreased.

In further detail, since the lateral ends of each Zener diode is applied with a voltage that is not higher than the breakdown voltage, the regulated voltage RV1 maintains a voltage that is higher by the Zener breakdown voltage than the voltage of the power supply PS, the first voltage source VS1 maintains a voltage that is higher by the Zener breakdown voltage than the regulated voltage RV1, and the second voltage source maintains a voltage that is higher by the Zener breakdown voltage than the first voltage source VS1 in the high-voltage process in which the voltage of the power supply PS is sufficiently high. If it is assumed that the regulated voltage RV1 is maintained at a constant level, the voltage of the first voltage source VS1 becomes the maximum voltage when the Zener diode ZD21 is in the Zener breakdown mode and the voltage of the second voltage source VS1 becomes the maximum voltage when the Zener diodes ZD21 and ZD31 are in the Zener breakdown mode. The number of Zener diodes included in each of the third to fifth Zener diode strings 203, 204, and 206 is determined according to the regulated voltage V1, the maximum voltage of the first voltage source VS1, and the maximum voltage of the second voltage source VS2 in the high-voltage process.

When the voltage of the power supply PS is decreased to be low enough to not change each of the plurality of Zener diodes connected in series to be in the breakdown mode, the voltages of the first and second voltage sources VS1 and VS2 applied to the gates of the auxiliary transistors M21 and M22 may not be high enough to turn on the auxiliary transistors M21 and M22. First, when the auxiliary transistor M22 is not fully turned on, the bypass switch M32 is turned on. In addition, the voltage of the power supply PS is further decreased, and thus when the auxiliary transistor M21 is not fully turned on, the bypass switch M31 is turned on.

When the bypass switch M32 is turned on, the voltage of the power source PS is directly applied to the drain of the auxiliary transistor M21. In addition, a voltage obtained by subtracting the amount of voltage drop due to the current limiting element 201 and the first and second current sources 205 and 207 from the voltage of the power supply PS is applied to the cathode of the Zener diode ZD11 through the first and second current sources 205 and 207, and therefore the Zener diode ZD11 is changed to the Zener breakdown mode first. In addition, a voltage obtained by subtracting the amount of voltage drop due to the current limiting element 201 and the second current source 207 from the voltage of the power supply PS is applied to the Zener diode ZD21 through the second current source 207, and therefore the Zener diode ZD21 is changed to the Zener breakdown mode.

When the voltage of the power supply PS is further decreased so that the two Zener diodes ZD21 and ZD11 cannot be changed to the Zener breakdown mode, the bypass switch M31 is turned on and the voltage of the power supply PS is directly applied to the drain electrode of the main transistor M11. In this case, the bypass switch M32 may be in the turn-on state. Substantially, when the bypass switch M31 is turned on, turn-on/off of the bypass switch M32 does not influence operation because the voltage of the power supply PS is applied to the drain of the main transistor M11. In addition, since the voltage obtained by subtracting the amount of voltage drop due to the current limiting element 201 and the first and second current sources 205 and 207 from the voltage of the power supply PS is applied to the cathode of the Zener diode ZD11 through the first and second current sources 205 and 207, the Zener diode ZD11 is changed to the Zener breakdown mode.

The bypass switches M31 and M32 of the present exemplary embodiment of the present invention may be realized as the depletion-type MOSFET as in the previously-described exemplary embodiment of the present invention.

Figure 7:
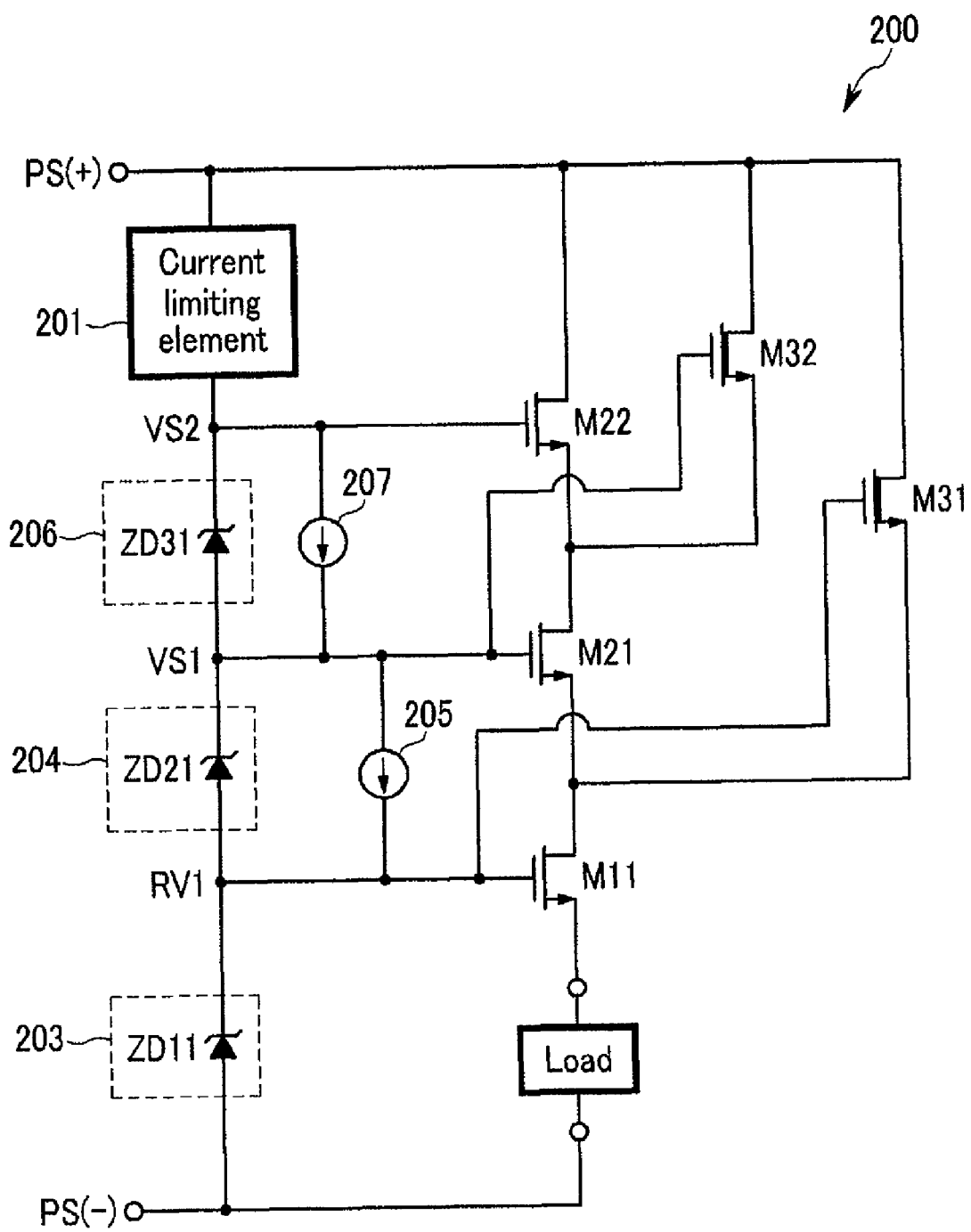
FIG. 7 shows a bypass switch of the driving circuit according to the other exemplary embodiment of the present invention, realized as a depletion-type MOSFET.

FIG. 7 shows the bypass switches M31 and M32 of the driving circuit according to the other exemplary embodiment of the present invention, realized as the depletion-type MOSFET.

As shown in FIG. 7, if the bypass switches M31 and M32 are n-channel depletion-type MOSFETs, a gate electrode of the bypass switch M31 is connected to a gate electrode of the main transistor M11 and a gate electrode of the bypass switch M32 is connected to a gate electrode of the auxiliary transistor M21.

When the voltage of the power supply PS is decreased, the Zener diode ZD11 and the Zener diode ZD21 are changed to the Zener breakdown mode and the Zener diode ZD31 is not changed to the Zener breakdown mode, and a source voltage of the auxiliary transistor M22 is decreased due to the decrease of the voltage of the power source PS. In this case, the gate voltage of the bypass switch M32 is the voltage of the first voltage source VS1 and the source voltage is decreased, and therefore a gate-source voltage of the bypass switch M31 becomes higher than a threshold voltage so that the bypass switch M31 is turned on and a gate-source voltage of the auxiliary transistor M22 becomes lower than the threshold voltage so that the auxiliary transistor M22 cannot be fully turned on. When the voltage of the power supply PS is further decreased, the auxiliary transistor M22 is turned off.

When the voltage of the power supply PS is further decreased, only the Zener diode ZD11 is changed to the Zener breakdown mode and the Zener diodes ZD21 and ZD31 are not changed into the Zener breakdown mode, and the source voltage of the auxiliary transistor M22 is decreased due to the decrease of the voltage of the power source PS. In this case, the gate voltage of the bypass switch M32 is the regulated voltage RV1 and the source voltage is decreased, and therefore the gate-source voltage of the bypass switch M31 becomes higher than the threshold voltage so that the bypass switch M31 is turned on and the gate-source voltage of the auxiliary transistor M21 becomes lower than the threshold voltage so that the auxiliary transistor M21 cannot be fully turned on. When the voltage of the power supply is further decreased, the auxiliary transistor M21 is turned off.

As described, the driving device according to the exemplary embodiments of the present invention prevents breakdown of the main transistor by turning on the auxiliary transistor in the high-voltage process in which the voltage of the power supply is high. In addition, the driving device according to the exemplary embodiments of the present invention directly connects the power supply to the main transistor when the voltage of the power supply is low so as to supply sufficient current to the load.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A driving device comprising:
    a main transistor that supplies a current to a load by using a power supply;
    at least one auxiliary transistor that drops a predetermined voltage among voltages of the power supply and transmits the dropped voltage to the main transistor in a turn-on state; and
    at least one bypass switch that transmits the voltage of the power supply to the main transistor when the at least one auxiliary transistor is turned off.

2. The driving device of claim 1, wherein the at least one auxiliary transistor has a first electrode and a second electrode respectively connected to the power supply and a first electrode of the main transistor, and lateral ends of the at least one bypass switch are respectively connected to the power supply and the first electrode of the main transistor.

3. The driving device of claim 2, wherein a regulated voltage that is a constant voltage is applied to a control electrode of the main transistor and a voltage of a voltage source is applied to a control electrode of the at least one auxiliary transistor, and the voltage of the voltage source is not higher than a predetermined maximum voltage and varies according to a voltage of the power supply.

4. The driving device of claim 3, wherein the predetermined maximum voltage is set by a sum of a maximum threshold voltage allowed to the first and second electrodes of the main transistor and the regulated voltage.

5. The driving device of claim 3, wherein the power supply comprises a positive electrode and a negative electrode, and the driving device comprises:
    a current limiting element having a first end connected to the positive electrode;
    a first Zener diode string having a first end connected to a second end of the current limiting element; and
    a second Zener diode string having a first end connected to a second end of the first Zener diode string, and
    the regulated voltage is a voltage at a first end of the second Zener diode and the voltage source is a voltage at a first end of the first Zener diode.

6. The driving device of claim 5, further comprising a current source connected in parallel with the first Zener diode string,
    wherein when a voltage of the power supply is low, a voltage that is dropped by a voltage at the lateral ends of the current limiting element and a voltage at the lateral ends of the current source from the voltage of the power supply is supplied to the second Zener diode string.

7. The driving device of claim 5, wherein the first and second Zener diode strings respectively include at least one Zener diode, and the number of Zener diodes is determined according to the regulated voltage and a maximum voltage of the voltage source.

8. The driving device of claim 7, wherein the first Zener diode string comprises a number of Zener diodes determined according to the regulated voltage, and the Zener diodes are connected in series and are multi-layered.

9. The driving device of claim 7, wherein the second Zener diode string comprises a number of Zener diodes determined according to the maximum voltage source, and the Zener diodes are connected in series and are multi-layered.

10. The driving device of claim 7, wherein the current limiting element is a depletion-type NMOSEFT of which a gate and a source are connected and a drain is connected to the power supply.

11. The driving device of claim 7, wherein the current limiting element is a resistor having a first end connected to the power supply and a second end connected to a first end of the first Zener diode.

12. The driving device of claim 2, wherein the at least one bypass switch is realized as a depletion-type MOSFET element, and has a first electrode connected to the power supply and a second electrode connected to the first electrode of the main transistor.

13. The driving device of claim 12, wherein the main and auxiliary transistors are NMOSFET elements, and the at least one bypass switch is a depletion-type NMOSFET element.

14. The driving device of claim 1, wherein the at least one auxiliary transistor includes at least first and second auxiliary transistors, and the first and second auxiliary transistors have a multi-layered structure by being connected between the power supply and the first electrode of the main transistor.

15. The driving device of claim 14, wherein the number of bypass switches is the same as the number of the auxiliary transistors.

16. The driving device of claim 15, wherein two or more voltage sources are respectively connected to control electrodes of the auxiliary transistors, and a constant regulated voltage is applied to a control electrode of the main transistor.

17. The driving device of claim 16, further comprising:
a first Zener diode string including at least one Zener diode having lateral ends connected between the control electrode of each of the auxiliary transistors; and
a second Zener diode string including at least one Zener diode having lateral ends connected to a control electrode of the first auxiliary transistor that is adjacent to the main transistor and the control electrode of the main transistor.

18. The driving device of claim 17, further comprising:
a first current source connected in parallel with the first Zener diode string; and
a second current source connected in parallel with the second Zener diode string.

19. The driving device of claim 14, comprising two or more bypass switches located corresponding to each of the auxiliary transistors, wherein each of the two or more bypass switches has a first end connected to the power supply and a second end connected to an electrode interposed between the corresponding auxiliary transistor and the main transistor, and is turned on when the voltage of the power supply is decreased so that the corresponding auxiliary transistor is turned off.

20. The driving device of claim 19, wherein the bypass switch is realized as a depletion-type MOSFET.

* * * * *